(12) United States Patent
Morikazu et al.

(10) Patent No.: US 9,193,008 B2
(45) Date of Patent: Nov. 24, 2015

(54) LASER PROCESSING METHOD AND LASER PROCESSING APPARATUS

(75) Inventors: Hiroshi Morikazu, Ota-Ku (JP); Keiji Nomaru, Ota-Ku (JP); Yoko Nishino, Ota-ku (JP)

(73) Assignee: DISCO CORPORATION, Tokyo (JP)

( * ) Notice: Subject to any disclaimer, the term of this patent is extended or adjusted under 35 U.S.C. 154(b) by 7 days.

(21) Appl. No.: 13/473,824

(22) Filed: May 17, 2012

(65) Prior Publication Data

US 2012/0292297 A1 Nov. 22, 2012

(30) Foreign Application Priority Data

May 19, 2011 (JP) ................. 2011-112484

(51) Int. Cl.
| | |
|---|---|
| B23K 26/00 | (2014.01) |
| B23K 26/06 | (2014.01) |
| B23K 26/02 | (2014.01) |
| H01L 21/00 | (2006.01) |
| B23K 26/08 | (2014.01) |
| B23K 26/36 | (2014.01) |
| B23K 26/40 | (2014.01) |
| B23K 26/30 | (2014.01) |
| H01L 33/00 | (2010.01) |

(52) U.S. Cl.
CPC .......... *B23K 26/0078* (2013.01); *B23K 26/063* (2013.01); *B23K 26/0613* (2013.01); *B23K 26/0639* (2013.01); *B23K 26/0853* (2013.01); *B23K 26/367* (2013.01); *B23K 26/4025* (2013.01); *B23K 26/4075* (2013.01); *B23K 26/421* (2013.01); *B23K 2201/40* (2013.01); *H01L 33/0095* (2013.01)

(58) Field of Classification Search
CPC .......... B23K 2201/40; B23K 26/0078; B23K 26/0613; B23K 26/0639; B23K 26/063
USPC .............. 219/121.6, 121.7, 121.61, 219/121.67–121.72, 121.76, 121.82; 438/462–463
See application file for complete search history.

(56) References Cited

U.S. PATENT DOCUMENTS

| | | | |
|---|---|---|---|
| 2007/0007472 A1* | 1/2007 | Genda ........................ | 250/548 |
| 2008/0011725 A1* | 1/2008 | Tsuchiya et al. ......... | 219/121.76 |
| 2008/0296275 A1* | 12/2008 | Oba et al. ................ | 219/121.75 |
| 2008/0299745 A1* | 12/2008 | Morikazu ................. | 438/463 |
| 2010/0003805 A1* | 1/2010 | Arai ......................... | 438/460 |
| 2011/0027971 A1* | 2/2011 | Fukuyo et al. ............. | 438/462 |

FOREIGN PATENT DOCUMENTS

| | | |
|---|---|---|
| JP | 2005-353935 | 12/2005 |
| JP | 2008-272794 | 11/2008 |
| JP | 2010-093244 | 4/2010 |
| JP | 2010-142862 | 7/2010 |

* cited by examiner

*Primary Examiner* — Tu B Hoang
*Assistant Examiner* — Michael Hoang
(74) *Attorney, Agent, or Firm* — Greer Burns & Crain, Ltd.

(57) ABSTRACT

A laser processing method of applying a pulsed laser beam to a workpiece formed from a transparent member, thereby performing laser processing to the workpiece. The laser processing method includes a first laser processing step of applying a first pulsed laser beam to a subject area of the workpiece to roughen the subject area and a second laser processing step of applying a second pulsed laser beam to the roughened subject area immediately after performing the first laser processing step, thereby forming a recess in the subject area. The first and second laser processing steps are repeated to thereby form a continuous groove in the subject area.

7 Claims, 6 Drawing Sheets

LASER PROCESSING METHOD AND LASER PROCESSING APPARATUS

BACKGROUND OF THE INVENTION

1. Field of the Invention

The present invention relates to a laser processing method and apparatus for applying a pulsed laser beam to a workpiece formed from a transparent member, thereby performing laser processing to the workpiece.

2. Description of the Related Art

In a semiconductor device fabrication process, a plurality of crossing division lines called streets are formed on the front side of a substantially disk-shaped semiconductor wafer formed from a silicon substrate to thereby partition a plurality of regions where circuits such as ICs and LSIs are respectively formed. The semiconductor wafer is cut along the streets to thereby divide the regions where the circuits are formed from each other, thus obtaining individual semiconductor chips. Further, an optical device wafer is provided by forming gallium nitride compound semiconductor or the like on the front side of a substrate such as a sapphire substrate, silicon carbide substrate, silicon dioxide substrate, lithium tantalate substrate, and lithium niobate substrate. The optical device wafer is also cut along the streets to obtain individual optical devices divided from each other, such as light emitting diodes and laser diodes, which are widely used in electric equipment.

As a method of dividing a wafer such as a semiconductor wafer along the streets, there has recently been proposed a method including the steps of applying a pulsed laser beam having an absorption wavelength (e.g., 532 nm, 355 nm, 266 nm) to the wafer along the streets to thereby form laser processed grooves on the wafer along the streets by ablation and next breaking the wafer along the laser processed grooves (see Japanese Patent Laid-open No. 2005-353935, for example).

SUMMARY OF THE INVENTION

However, a sapphire substrate, silicon carbide substrate, silicon dioxide substrate, lithium tantalate substrate, and lithium niobate substrate, are each a transparent member, so that the pulsed laser beam having a wavelength of 532 nm, 355 nm, or 266 nm can transmit through the substrate. As a result, the above conventional laser processing method is poor in energy absorptivity and it is difficult to efficiently form the laser processed grooves.

It is therefore an object of the present invention to provide a laser processing method and a laser processing apparatus which can efficiently perform laser processing by applying a pulsed laser beam to a workpiece formed from a transparent member.

In accordance with an aspect of the present invention, there is provided a laser processing method of applying a pulsed laser beam to a workpiece formed from a transparent member, thereby performing laser processing to the workpiece, the laser processing method including a first laser processing step of applying a first pulsed laser beam to a subject area of the workpiece to roughen the subject area; and a second laser processing step of applying a second pulsed laser beam to the subject area roughened by the application of the first pulsed laser beam immediately after performing the first laser processing step, thereby forming a recess in the subject area; the first laser processing step and the second laser processing step being repeated to thereby form a continuous groove in the subject area.

Preferably, the power of the first pulsed laser beam is set to a value higher than the power of the second pulsed laser beam.

In accordance with another aspect of the present invention, there is provided a laser processing apparatus for applying a pulsed laser beam to a workpiece formed from a transparent member, thereby performing laser processing to the workpiece, the laser processing apparatus including workpiece holding means for holding the workpiece; pulsed laser beam applying means for applying the pulsed laser beam to the workpiece held by the workpiece holding means; and moving means for relatively moving the workpiece holding means and the pulsed laser beam applying means; the pulsed laser beam applying means including a pulsed laser oscillator; optical branching means for branching a pulsed laser beam oscillated by the pulsed laser oscillator into a first pulsed laser beam traveling along a first path and a second pulsed laser beam traveling along a second path; delay means provided on the second path for delaying the second pulsed laser beam; optical combining means for leading the first pulsed laser beam and the second pulsed laser beam to a third path; and focusing means provided on the third path for focusing the first pulsed laser beam and the second pulsed laser beam onto the workpiece held by the workpiece holding means.

Preferably, the pulsed laser beam applying means further includes a half-wave plate provided between the pulsed laser oscillator and the optical branching means.

In the laser processing method according to the present invention, the first laser processing step of applying the first pulsed laser beam to thereby roughen the subject area is first performed. Immediately after performing the first laser processing step, the second laser processing step of applying the second pulsed laser beam to the roughened subject area to thereby form the recess in this roughened subject area. Accordingly, although the workpiece is formed from a transparent member, the second pulsed laser beam can be effectively absorbed to thereby efficiently form the recess. By repeating the first laser processing step of applying the first pulsed laser beam to roughen the subject area and the second laser processing step of applying the second pulsed laser beam to the roughened subject area to form the recess, a continuous groove can be efficiently formed.

In the laser processing apparatus according to the present invention, the pulsed laser beam applying means includes the pulsed laser oscillator, the optical branching means for branching the pulsed laser beam oscillated by the pulsed laser oscillator into the first pulsed laser beam traveling along the first path and the second pulsed laser beam traveling along the second path, the delay means provided on the second path for delaying the second pulsed laser beam, the optical combining means for leading the first pulsed laser beam and the second pulsed laser beam to the third path, and the focusing means provided on the third path for focusing the first pulsed laser beam and the second pulsed laser beam onto the workpiece held by the workpiece holding means. Accordingly, in performing the laser processing method mentioned above, it is possible to efficiently perform the first laser processing step of applying the first pulsed laser beam to the subject area of the workpiece to roughen the subject area and the second laser processing step of applying the second pulsed laser beam to the subject area roughened by the application of the first pulsed laser beam immediately after performing the first laser processing step, thereby forming the recess in the subject area.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
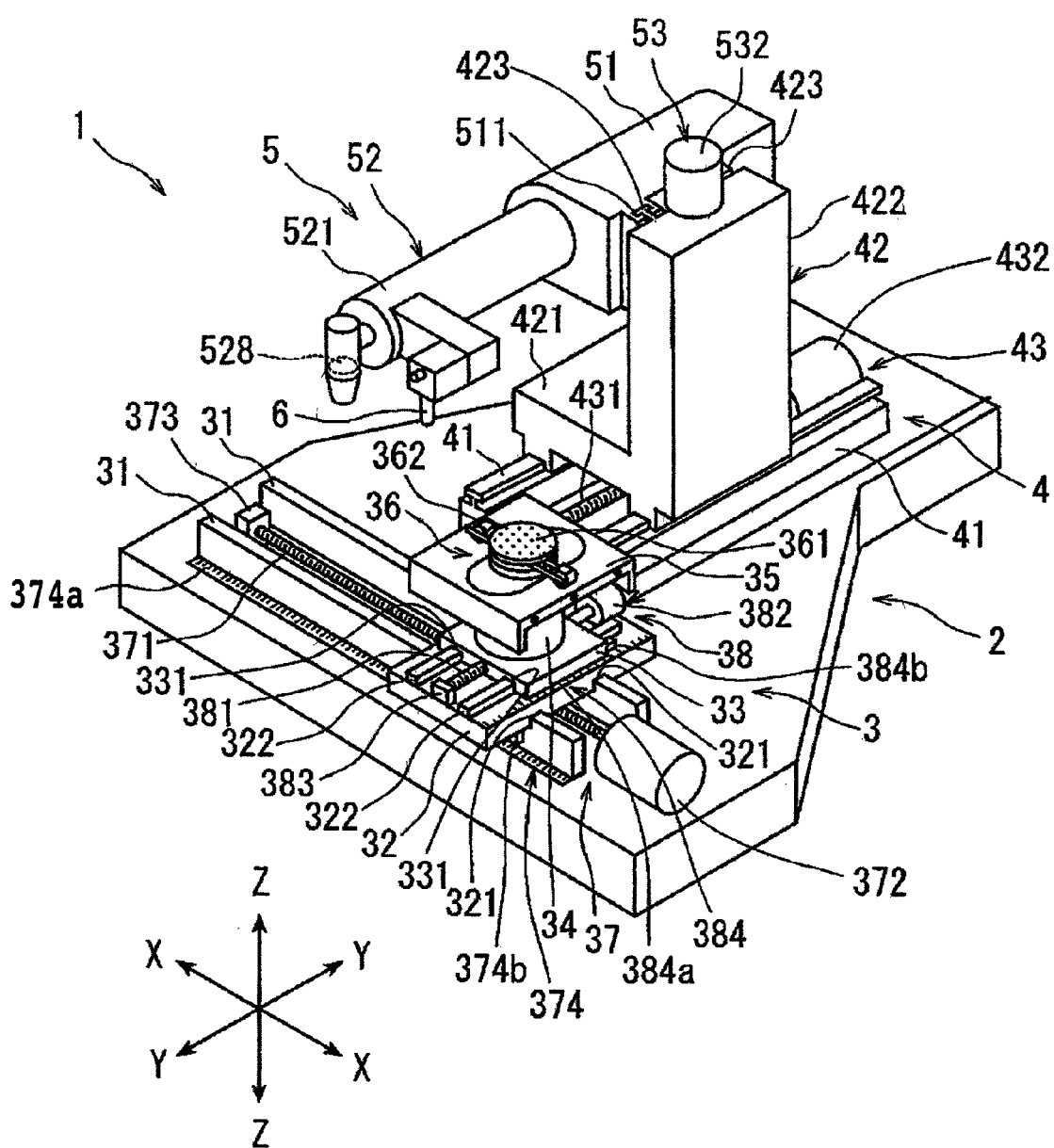
FIG. 1 is a perspective view of a laser processing apparatus according to the present invention.

A preferred embodiment of the laser processing method and apparatus according to the present invention will now be described in detail with reference to the attached drawings. FIG. 1 is a perspective view of a laser processing apparatus 1 for performing the laser processing method according to the present invention. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the vacuum chuck 361 by operating suction means (not shown). The chuck table 36 is rotatable by a pulse motor (not shown) provided in the cylindrical member 34. Further, the chuck table 36 is provided with clamps 362 for fixing an annular frame (to be hereinafter described).

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 in the preferred embodiment shown in the figure further includes feeding means 37 for moving the first slide block 32 in the X direction along the guide rails 31. The feeding means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The laser processing apparatus 1 includes feed amount detecting means 374 for detecting the feed amount of the chuck table 36. The feed amount detecting means 374 includes a linear scale 374a extending along one of the guide rails 31 and a read head 374b provided on the first slide block 32 and movable along the linear scale 374a together with the first slide block 32. The read head 374b of the feed amount detecting means 374 transmits a pulse signal of one pulse every 0.1 μm in this preferred embodiment shown in the figure to control means which will be hereinafter described. This control means counts the number of pulses as the input pulse signal to thereby detect the feed amount of the chuck table 36. In the case that the pulse motor 372 is used as the drive source for the feeding means 37 as in this preferred embodiment, the number of pulses as a drive signal output from the control means to the pulse motor 372 may be counted by the control means to thereby detect the feed amount of the chuck table 36. In the case that a servo motor is used as the drive source for the feeding means 37, a pulse signal output from a rotary encoder for detecting the rotational speed of the servo motor may be sent to the control means described hereinafter, and the number of pulses as the pulse signal input from the rotary encoder into the control means may be counted by the control means to thereby detect the feed amount of the chuck table 36.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 in the preferred embodiment shown in the figure further includes first indexing means 38 for moving the second slide block 33 in the Y direction along the pair of guide rails 322 provided on the first slide block 32. The first indexing means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser processing apparatus 1 includes index amount detecting means 384 for detecting the index amount of the chuck table 36. The index amount detecting means 384 includes a linear scale 384a extending along one of the guide rails 322 and a read head 384b provided on the second slide block 33 and movable along the linear scale 384a together with the second slide block 33. The read head 384b of the index amount detecting means 384 transmits a pulse signal of one pulse every 0.1 μm in this preferred embodiment to the control means. This control means counts the number of pulses as the input pulse signal to thereby detect the index amount of the chuck table 36. In the case that the pulse motor 382 is used as the drive source for the first indexing means 38 as in this preferred embodiment, the number of pulses as a drive signal output from the control means to the pulse motor 382 may be counted by the control means to thereby detect the index amount of the chuck table 36. In the case that a servo motor is used as the drive source for the first indexing means 38, a pulse signal output from a rotary encoder for detecting the rotational speed of the servo motor may be sent to the control means, and the number of pulses as the pulse signal supplied to the control means may be counted by the control means to thereby detect the index amount of the chuck table 36.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a slide support portion 421 slidably supported to the guide rails 41 and a vertical portion 422 extending vertically upward from the upper surface of the slide support portion 421. Further, a pair of guide rails 423 are provided on one side surface of the vertical portion 422 so as to extend parallel to each other in the Z direction. The laser beam applying unit supporting mechanism 4 further includes second indexing means 43 for moving the movable support base 42 in the Y direction along the guide rails 41. The second indexing means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the slide support portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511 for slidably engaging the pair of guide rails 423 provided on the vertical portion 422. Accordingly, the unit holder 51 is supported to the movable support base 42 so as to be movable in the Z direction by the slidable engagement of the guided grooves 511 with the guide rails 423.

The laser beam applying unit 5 further includes focal position adjusting means 53 for moving the unit holder 51 along the guide rails 423 in the Z direction. The focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the Z direction along the guide rails 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

Figure 2:
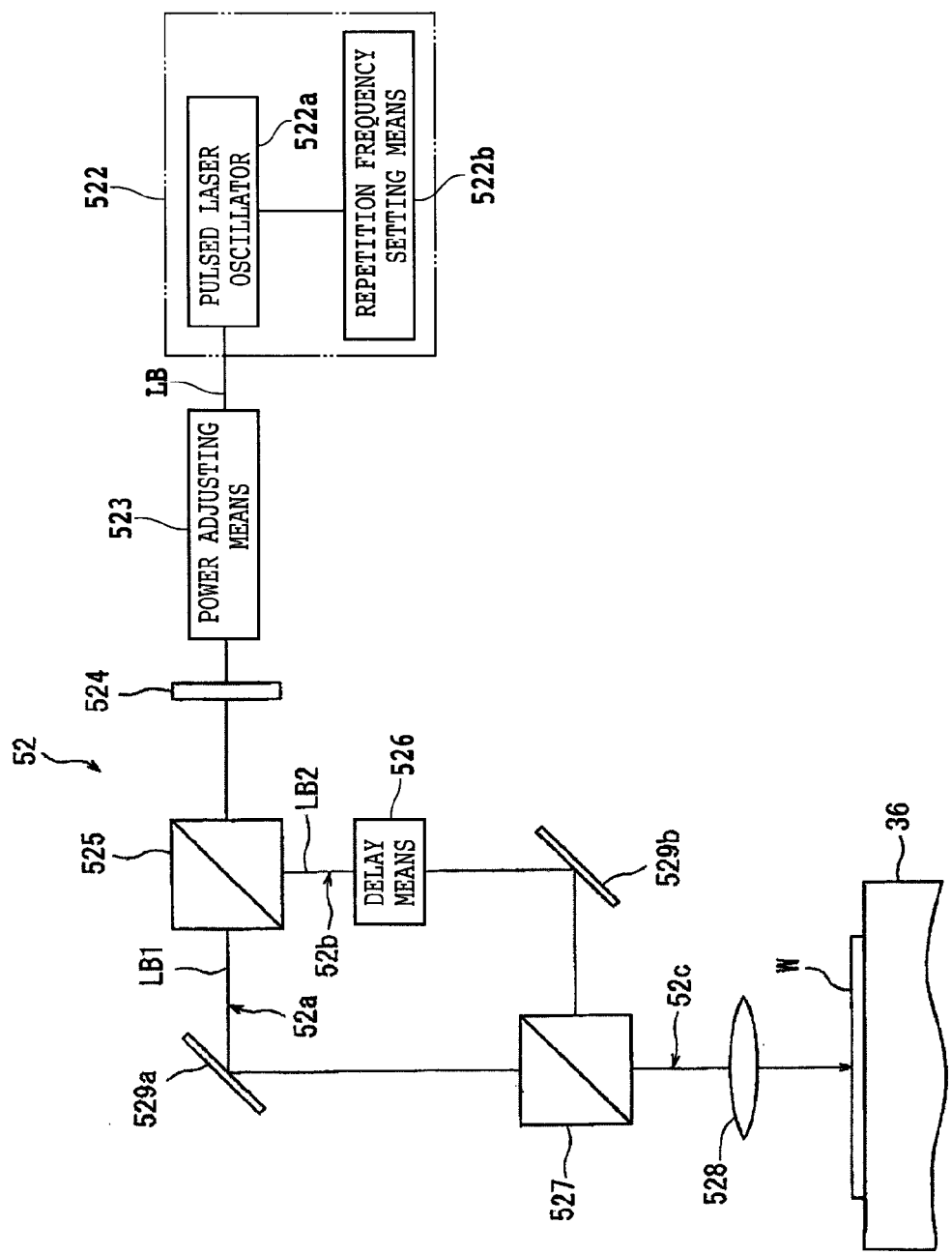
FIG. 2 is a schematic block diagram showing the configuration of laser beam applying means included in the laser processing apparatus shown in FIG. 1.

The laser beam applying means 52 will now be described with reference to FIGS. 1 and 2. The laser beam applying means 52 includes a cylindrical casing 521 fixed to the unit holder 51 so as to extend in a substantially horizontal direction, pulsed laser beam oscillating means 522 provided in the casing 521, power adjusting means 523 for adjusting the power of a pulsed laser beam LB oscillated by the pulsed laser beam oscillating means 522, a half-wave plate 524 for rotating the polarization plane of the pulsed laser beam LB whose power has been adjusted by the power adjusting means 523, optical branching means 525 provided by a polarization beam splitter for branching the pulsed laser beam LB whose polarization plane has been rotated by the half-wave plate 524 into a first pulsed laser beam LB1 of P waves traveling along a first path 52a and a second pulsed laser beam LB2 of S waves traveling along a second path 52b, delay means 526 provided on the second path 52b for delaying the second pulsed laser beam LB2, combining means 527 provided by a polarization beam splitter for leading the first pulsed laser beam LB1 and the second pulsed laser beam LB2 to a third path 52c, and a focusing lens 528 provided on the third path 52c for focusing the first pulsed laser beam LB1 and the second pulsed laser beam LB2 onto a workpiece W held on the chuck table 36.

A direction changing mirror 529a is provided between the optical branching means 525 and the combining means 527 to change the traveling direction of the first pulsed laser beam LB1 led to the first path 52a by the optical branching means 525 toward the combining means 527. Further, a direction changing mirror 529b is provided between the delay means 526 and the combining means 527 to change the traveling direction of the second pulsed laser beam LB2 led to the second path 52b by the optical branching means 525 and delayed by the delay means 526 toward the combining means 527.

The pulsed laser beam oscillating means 522 is composed of a pulsed laser oscillator 522a such as a YAG laser oscillator or a YVO4 laser oscillator and repetition frequency setting means 522b connected to the pulsed laser oscillator 522a. The power adjusting means 523 functions to adjust the power of the pulsed laser beam LB oscillated by the pulsed laser beam oscillating means 522 to a predetermined power. The pulsed laser beam oscillating means 522 and the power adjusting means 523 are controlled by the control means to be hereinafter described.

The half-wave plate 524 functions to −θ rotate the polarization plane of linearly polarized light incident on the wave plate at an angle θ with respect to the optic axis of the crystal of the wave plate. That is, when the half-wave plate 524 is rotated by θ, the polarization plane of incident linearly polarized light is rotated by 2θ and the resultant linearly polarized light emerges from the half-wave plate 524. Accordingly, by suitably rotating the half-wave plate 524, the polarization plane of the pulsed laser beam LB can be arbitrarily rotated, thereby changing the ratio between the first pulsed laser beam LB1 of P waves to be led to the first path 52a by the optical branching means 525 and the second pulsed laser beam LB2 of S waves to be led to the second path 52b by the optical branching means 525. For example, when the half-wave plate 524 is rotated 22.5° with respect to the polarization plane of the incident pulsed laser beam LB, the polarization plane of the pulsed laser beam LB emerging from the half-wave plate 524 is rotated 45°, so that the first pulsed laser beam LB1 to be led to the first path 52a by the optical branching means 525 becomes 50% and the second pulsed laser beam LB2 to be led to the second path 52b by the optical branching means 525 becomes 50%. Further, when the half-wave plate 524 is rotated 15°, the polarization plane of the pulsed laser beam LB emerging from the half-wave plate 524 is rotated 30°, so that the first pulsed laser beam LB1 to be led to the first path 52a by the optical branching means 525 becomes about 66.5% and the second pulsed laser beam LB2 to be led to the second path 52b by the optical branching means 525 becomes about 33.5%.

The delay means 526 is formed of a material having a high refractive index, such as quartz and silicon dioxide ($SiO_2$). The delay means 526 functions to extend the time of transmission of the second pulsed laser beam LB2 and therefore substantially increase the optical path length of the second pulsed laser beam LB2. For example, the delay time by the delay means 526 is set so that the second pulsed laser beam LB2 is delayed from the first pulsed laser beam LB1 by 1 μsec until reaching the combining means 527. The combining means 527 is provided by a polarization beam splitter for leading both the first pulsed laser beam LB1 led to the first path 52a by the optical branching means 525 and the second pulsed laser beam LB2 led to the second path 52b by the optical branching means 525 toward the focusing lens 528.

Referring back to FIG. 1, imaging means 6 for detecting a subject area of the workpiece to be laser-processed by the laser beam applying means 52 is provided at the front end portion of the casing 521 constituting the laser beam applying means 52. The imaging means 6 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 6 is transmitted to the control means 8.

Figure 3:
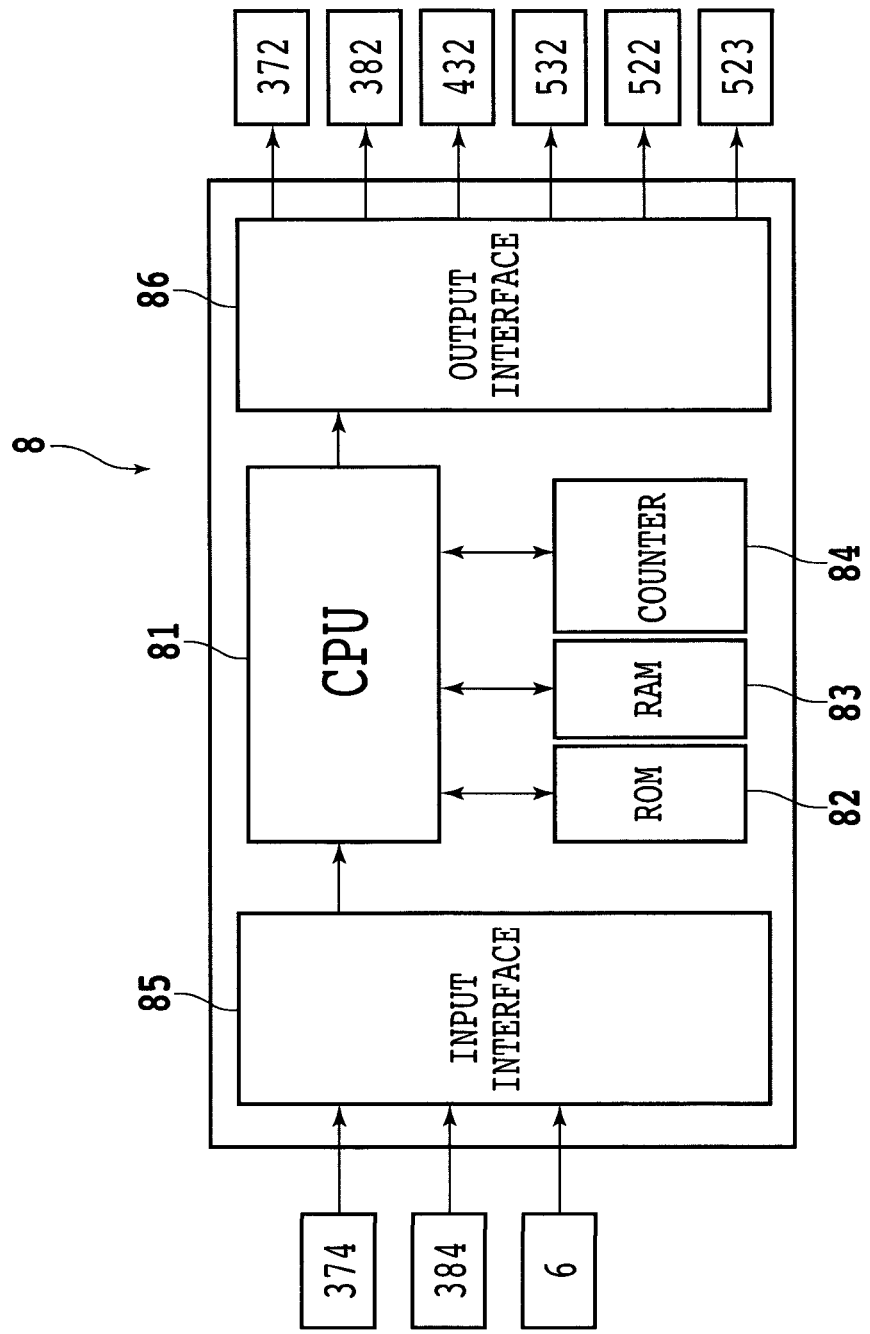
FIG. 3 is a block diagram of control means included in the laser processing apparatus shown in FIG. 1.

The laser processing apparatus 1 includes the control means 8 shown in FIG. 3. The control means 8 is configured by a computer, and it includes a central processing unit (CPU) 81 for performing operational processing according to a control program, a read only memory (ROM) 82 preliminarily storing such as the control program, a random access memory (RAM) 83 for storing the results of computation, etc., a counter 84, an input interface 85, and an output interface 86. Detection signals from the feed amount detecting means 374, the index amount detecting means 384, and the imaging means 6 are input into the input interface 85 of the control means 8. On the other hand, control signals are output from the output interface 86 of the control means 8 to the pulse motor 372, the pulse motor 382, the pulse motor 432, the pulse motor 532, the pulsed laser beam oscillating means 522 of the laser beam applying means 52, and the power adjusting means 523.

Figure 4:
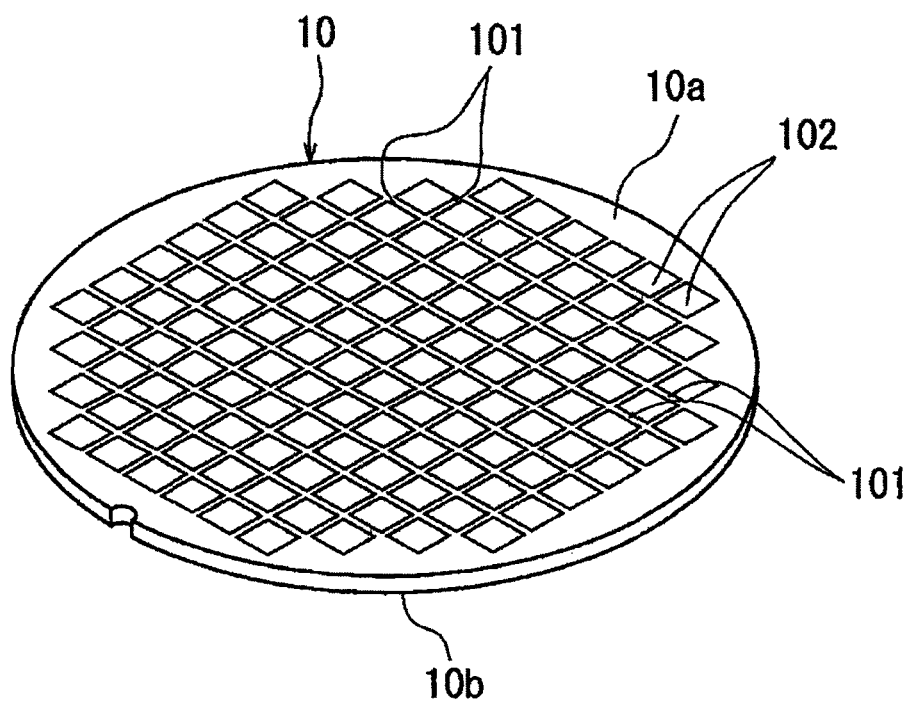
FIG. 4 is a perspective view of an optical device wafer to be processed by a laser processing method according to the present invention.

The operation of the laser processing apparatus 1 configured above will now be described. FIG. 4 is a perspective view of an optical device wafer 10 to be processed by the laser processing method according to the present invention. The optical device wafer 10 shown in FIGS. 4 and 6C is composed of a transparent substrate 11 and an optical device layer 12 formed on a front side 10a of the transparent substrate. The transparent substrate has a thickness of 100 μm, for example, and it is formed of sapphire, silicon carbide, silicon dioxide, lithium tantalate, or lithium niobate, for example. The optical device layer is formed of a nitride semiconductor. A plurality of crossing streets 101 are formed on the front side 10a of the wafer 10, thereby partitioning a plurality of rectangular regions where a plurality of optical devices 102 such as light emitting diodes and laser diodes are respectively formed. There will now be described a laser processed groove forming step of applying a laser beam for performing ablation to the front side or back side of the substrate of the wafer 10 along the streets 101 by using the laser processing apparatus 1 mentioned above, thereby forming a laser processed groove as a break start point on the front side or back side of the substrate of the wafer 10 along each street 101.

Figure 5A:
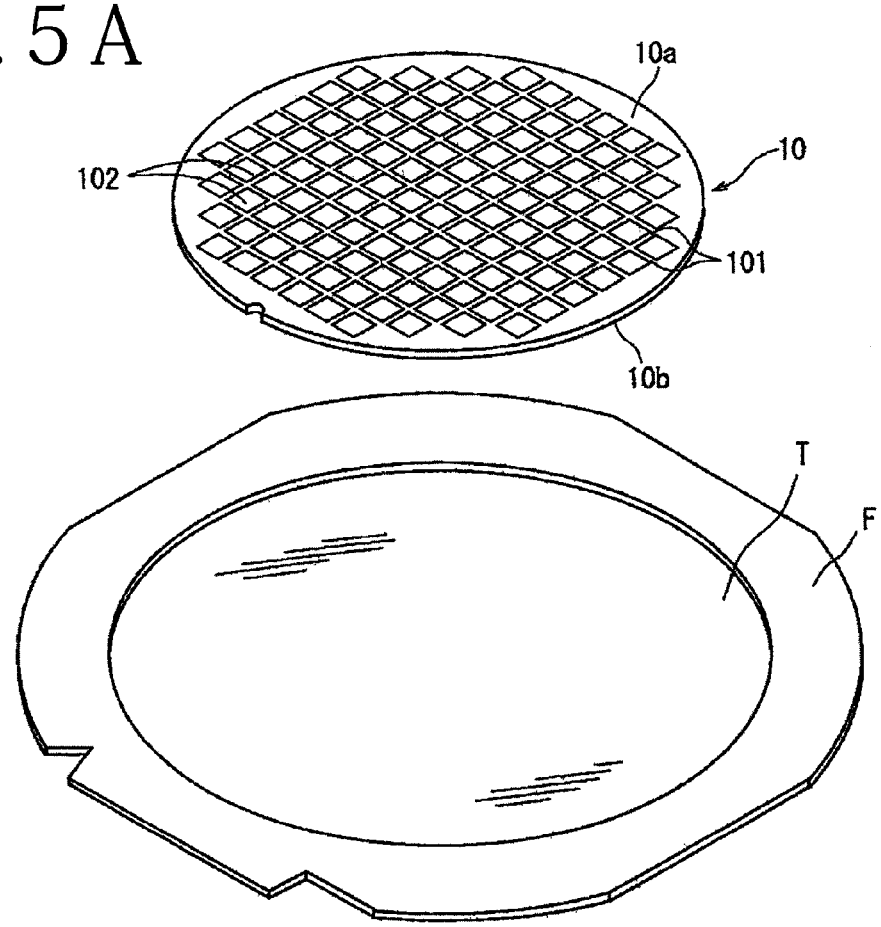
FIG. 5A is an exploded perspective view showing a step of attaching the optical device wafer shown in FIG. 4 to a protective tape supported to an annular frame.
Figure 5B:
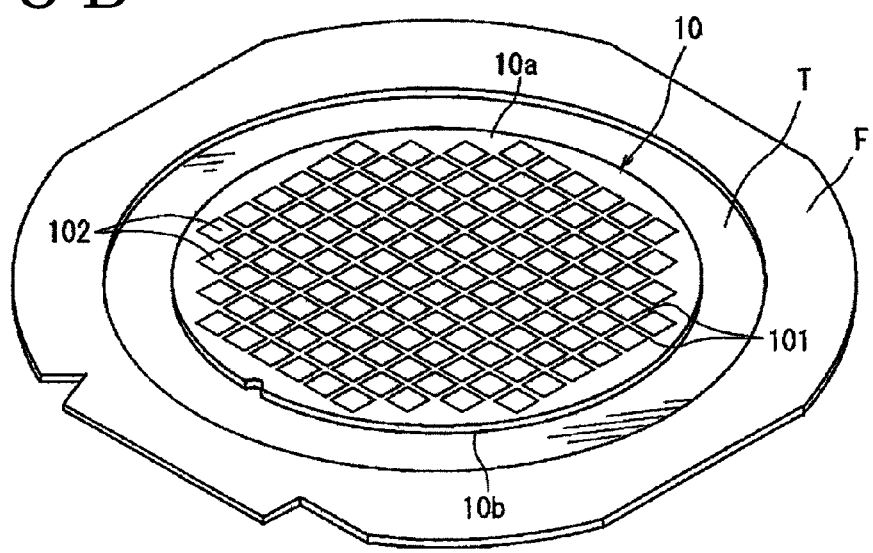
FIG. 5B is a perspective view showing a condition where the optical device wafer is attached to the protective tape shown in FIG. 5A.

First, a wafer supporting step is performed in such a manner that a back side 10b of the wafer 10 is attached to a dicing tape supported to an annular frame. More specifically, as shown in FIGS. 5A and 5B, a dicing tape T is preliminarily supported at its outer circumferential portion to an annular frame F so as to close the inner opening of the annular frame F. The back side 10b of the wafer 10 is attached to the front side (adhesive surface) of the dicing tape T.

After performing the wafer supporting step mentioned above, the wafer 10 supported through the dicing tape T to the annular frame F is placed on the chuck table 36 of the laser processing apparatus 1 shown in FIG. 1 in the condition where the dicing tape T comes into contact with the upper surface of the chuck table 36. Thereafter, the suction means (not shown) is operated to hold the wafer 10 through the dicing tape T on the chuck table 36 under suction (wafer holding step). Accordingly, the wafer 10 is held on the chuck table 36 in the condition where the front side 10a of the wafer 10 is oriented upward.

The feeding means 37 is operated to move the chuck table 36 holding the wafer 10 to a position directly below the imaging means 6. In the condition where the chuck table 36 is positioned directly below the imaging means 6, an alignment operation is performed by the imaging means 6 and the control means 8 to detect a subject area of the wafer 10 to be laser-processed. More specifically, the imaging means 6 and the control means 8 perform image processing such as pattern matching for making the alignment of the streets 101 extending in a first direction on the wafer 10 and the focusing lens 528 of the laser beam applying means 52 for applying the laser beam along the streets 101, thereby performing the alignment of a laser beam applying position. This alignment operation is performed similarly for the other streets 101 extending in a second direction perpendicular to the first direction mentioned above on the wafer 10.

Figure 6A:
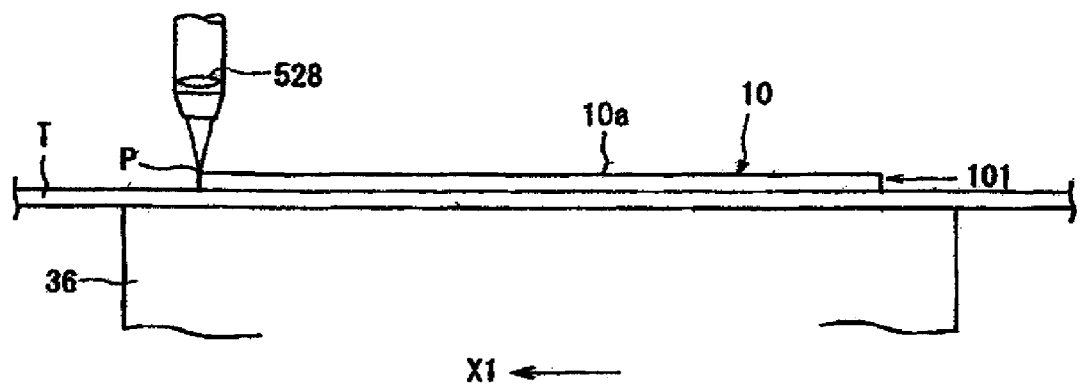
FIGS. 6A and 6B are sectional side views for illustrating a laser processed groove forming step.

After performing the alignment operation to detect all of the crossing streets 101 extending in the first and second directions on the wafer 10 held on the chuck table 36, the chuck table 36 is moved to position one end (left end as viewed in FIG. 6A) of a predetermined one of the streets 101 extending in the first direction directly below the focusing lens 528 of the laser beam applying means 52 as shown in FIG. 6A. Thereafter, the focal point P of the pulsed laser beam to be applied through the focusing lens 528 is set near the front side 10a (upper surface) of the wafer 10.

Thereafter, a first laser processing step is performed in such a manner that the first pulsed laser beam LB1 shown in FIG.

Figure 6B:
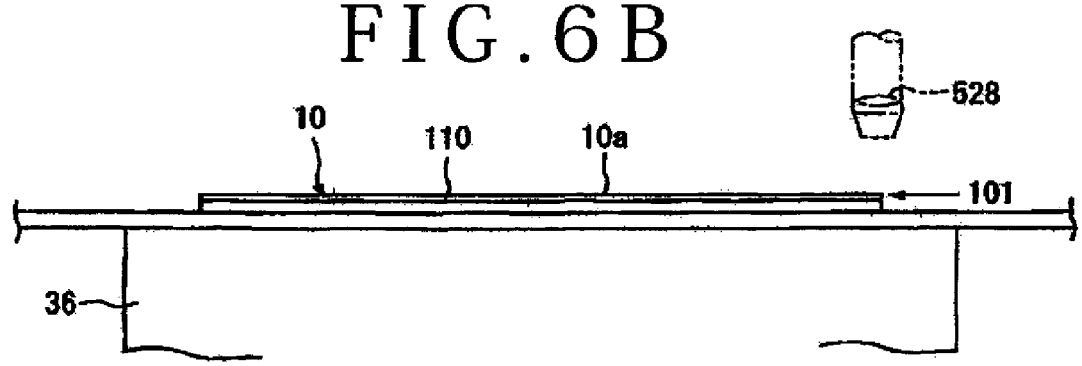
Figure 6C:
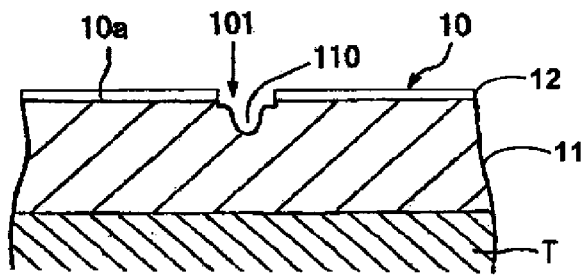
FIG. 6C is an enlarged sectional view of the wafer processed by the laser processed groove forming step.

2 is applied through the focusing lens 528 to the subject area of the wafer 10 by operating the laser beam applying means 52, thereby roughening the subject area of the wafer 10. Immediately after performing the first laser processing step, a second laser processing step is performed in such a manner that the second pulsed laser beam LB2 shown in FIG. 2 is applied through the focusing lens 528 to the subject area roughened by the application of the first pulsed laser beam LB1, thereby forming a recess in this roughened subject area of the wafer 10. The first laser processing step and the second laser processing step are performed alternately. Further, the chuck table 36 is moved in the direction shown by an arrow X1 in FIG. 6A at a predetermined feed speed. When the other end (right end as viewed in FIG. 6B) of the predetermined street 101 reaches the position directly below the focusing lens 528 as shown in FIG. 6B, the application of the first and second pulsed laser beams LB1 and LB2 is stopped and the movement of the chuck table 36 is also stopped (laser processed groove forming step).

For example, the laser processed groove forming step mentioned above is performed under the following processing conditions.

Light source: YAG pulsed laser
Wavelength: 532 nm, 355 nm, 266 nm
Repetition frequency: 50 kHz
Average power: 2 W
First pulsed laser beam LB1: 1.5 W
Second pulsed laser beam LB2: 0.5 W
Delay time: 1 μsec
Focused spot diameter: 1.5 μm
Work feed speed: 100 mm/sec In the laser processed groove forming step mentioned above, the first laser processing step of applying the first pulsed laser beam LB1 to roughen the subject area of the wafer 10 is first performed. Immediately after performing the first laser processing step, the second laser processing step of applying the second pulsed laser beam LB2 to the roughened subject area of the wafer 10 to form the recess in this roughened subject area. Accordingly, although the wafer 10 is formed from a transparent member, the second pulsed laser beam LB2 can be effectively absorbed to thereby efficiently form the recess. By repeating the first laser processing step of applying the first pulsed laser beam LB1 to roughen the subject area and the second laser processing step of applying the second pulsed laser beam LB2 to the roughened subject area to form the recess, a laser processed groove 110 is continuously formed along the predetermined street 101 as shown in FIGS. 6B and 6C. In this preferred embodiment, the power of the first pulsed laser beam LB1 to be applied in the first laser processing step is set to a value higher than the power of the second pulsed laser beam LB2 to be applied in the second laser processing step. Accordingly, the subject area can be effectively roughened.

After performing the laser processed groove forming step along all of the streets 101 extending in the first direction on the wafer 10, the chuck table 36 is rotated 90° to similarly perform the laser processed groove forming step along all of the other streets 101 extending in the second direction perpendicular to the first direction.

Thereafter, the wafer 10 is transported to a position where a wafer dividing step is performed in such a manner that an external force is applied to the wafer 10 to thereby break the wafer 10 along the streets 101 where the laser processed grooves 110 are formed as break start points, thereby dividing the wafer 10 into the individual optical devices.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method of applying a pulsed laser beam to a workpiece formed from a substrate with an optical device layer formed thereon, thereby performing laser processing to said workpiece, wherein said substrate is of a material transparent to beams of wavelengths between 266 nm and 532 nm, inclusive, said laser processing method comprising:
    a first laser processing step of applying a first pulsed laser beam to a subject area of said workpiece to roughen said subject area of said substrate, wherein said first pulsed laser beam is of a sufficient power to roughen said subject area; and
    a second laser processing step of applying a second pulsed laser beam to said subject area roughened by the application of said first pulsed laser beam immediately after performing said first laser processing step, thereby forming a recess in said subject area;
    said first laser processing step and said second laser processing step being repeated alternately to the same subject area to thereby form a continuous groove in said subject area,
    wherein said first laser processing step roughens said subject area of said substrate enough to enable said second pulsed laser beam to be sufficiently absorbed by said substrate to form the recess in said subject area during said second laser processing step, and
    wherein the power of said first pulsed laser beam is set to a value higher than the power of said second pulsed laser beam.

2. The laser processing method according to claim 1, wherein said second pulsed laser beam passes through a delay means prior to being applied to said subject area.

3. The laser processing method according to claim 1, wherein the power of said first pulsed laser beam is set to a value that is triple that of the power of said second pulsed laser beam.

4. The laser processing method according to claim 1, wherein said substrate is comprised of a material selected from the group consisting of sapphire, silicon carbide, silicon dioxide, lithium tantalate and lithium niobate.

5. The laser processing method according to claim 1, wherein said substrate has a thickness of 100 μm.

6. The laser processing method according to claim 1, wherein said alternating of said first laser processing step and said second laser processing step is performed while moving said workpiece at one predetermined feed speed.

7. The laser beam processing method according to claim 1, further comprising the following step, which is performed prior to performing said first laser processing step:
    directing a third pulsed laser beam to a polarization beam splitter to branch the pulsed laser beam into said first pulsed laser beam consisting of P waves and said second pulsed laser beam consisting of S waves.

* * * * *